United States Patent
Okura et al.

(10) Patent No.: US 6,185,108 B1
(45) Date of Patent: Feb. 6, 2001

(54) EQUIPMENT CONTROL PANEL WITH OPERATION SIGNAL GENERATING SWITCH

(75) Inventors: Michitaka Okura, Nagoya; Tomonori Miyajima, Aichi, both of (JP)

(73) Assignee: Toyotomi Co., Ltd., Nagoya (JP)

(*) Notice: Under 35 U.S.C. 154(b), the term of this patent shall be extended for 0 days.

(21) Appl. No.: 09/269,558

(22) PCT Filed: Jul. 31, 1998

(86) PCT No.: PCT/JP98/03434

§ 371 Date: Mar. 30, 1999

§ 102(e) Date: Mar. 30, 1999

(87) PCT Pub. No.: WO99/07198

PCT Pub. Date: Feb. 11, 1999

(30) Foreign Application Priority Data

Jul. 31, 1997 (JP) .................................................. 9-221087

(51) Int. Cl.$^7$ .................................. H05K 7/00; H05K 9/00
(52) U.S. Cl. .......................... 361/816; 361/758; 361/799; 361/807; 361/818; 174/35 R
(58) Field of Search ..................................... 361/679, 728, 361/752, 753, 748–751, 796, 799, 800, 807, 816, 818; 174/35 R, 35 MS, 50, 51, 52.1, 52.3

(56) References Cited

U.S. PATENT DOCUMENTS

| | | | |
|---|---|---|---|
| 5,736,070 | * | 4/1998 | Murakami et al. ................... 252/512 |
| 5,844,362 | * | 12/1998 | Tanabe et al. ........................ 313/506 |
| 5,981,043 | * | 11/1999 | Murakami et al. ................... 428/209 |

* cited by examiner

Primary Examiner—Jayprakash N. Gandhi
(74) Attorney, Agent, or Firm—Pollock, Vande Sande & Amernick

(57) ABSTRACT

An equipment control panel (1) is provided which is capable of preventing malfunction of a control unit (11) arranged in a casing (5) of an equipment or a failure in operation thereof due to discharge of static electricity. An insulating spacer (33) including a conductive shield layer (35) is arranged on a flexible circuit board (15) formed on a main section (15B) thereof with a circuit pattern including contact sections. An insulating cover sheet member (45) is laminated on the insulating spacer (33). The conductive shield layer (35) is arranged so as to be substantially opposite to a circuit pattern (21). The conductive shield layer (35) is so formed that an outer peripheral edge thereof is positioned inside an outer peripheral edge of each of a main section (33B) of the insulating spacer (33) and the insulating cover sheet member (45). The conductive shield layer (35) is covered at the outer peripheral edge thereof with an adhesive layer (51) to keep the conductive shield layer (35) from being externally exposed.

16 Claims, 4 Drawing Sheets

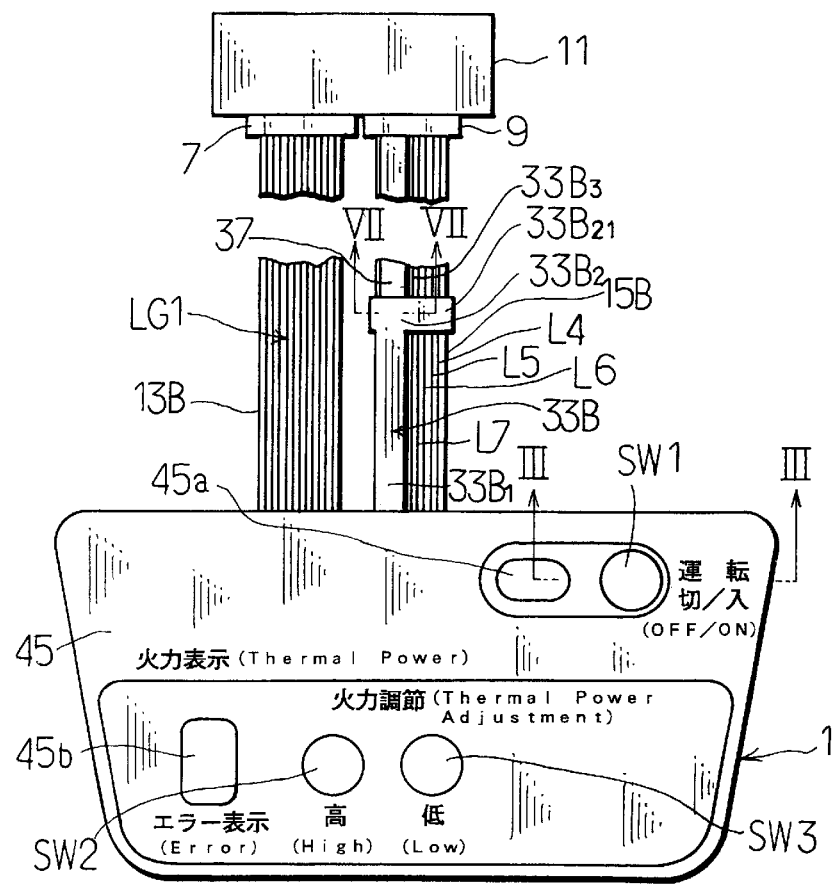
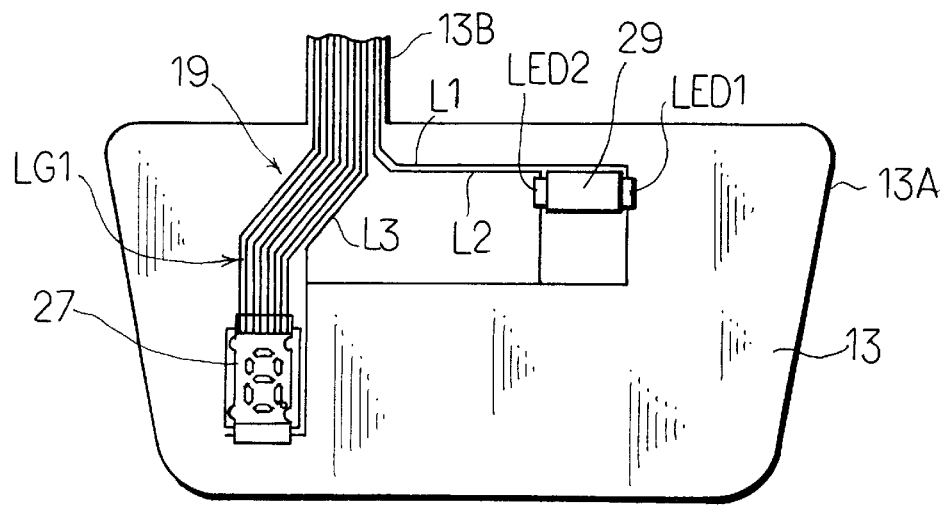

EQUIPMENT CONTROL PANEL WITH OPERATION SIGNAL GENERATING SWITCH

TECHNICAL FIELD

This invention relates to a control panel for an equipment, and more particularly to an equipment control panel including at least one operation signal generating switch for feeding an operation signal to a control unit received in an equipment.

BACKGROUND ART

An equipment such as an oil-fired space heater, a gas-fired space heater or the like includes a control section which is provided with electric parts such as a switch and a variable resistor for driving the equipment, a luminous display section for displaying a state of operation of the equipment, and the like. A conventional equipment control panel generally includes a circuit board which has such electric parts mounted thereon and is supported on a frame made of synthetic resin. The frame on which the circuit board is thus supported is fixed on a casing of the equipment in such a manner that the electric parts which are required to be externally operated and the luminous display means are positioned in an opening provided at the casing of the equipment. Alternatively, the frame may be fixed on a wall of a room in which the equipment is placed while being away from the equipment. Also, the circuit board is covered on a surface of a portion thereof positionally corresponding to the electric parts such as the switch and the like which are required to be externally operated with an insulating cover member exhibiting at least flexibility. Between the circuit board and the insulating cover member is arranged an insulating spacer.

Such construction of the conventional equipment control panel causes mounting of the equipment control panel on the casing of the equipment to require to form the casing with an opening of an increased size. Unfortunately, this not only renders design of the casing of the equipment troublesome but causes a portion of the casing on which the equipment control panel is to be mounted to be subject to positional restriction. Also, it renders mounting of the equipment control panel on the casing of the equipment troublesome.

In addition, equipments such as a forced flue oil-fired space heater (fan heater) and the like are affected by high-frequency noise to be generated from various electric units placed in proximity to the equipment and elements arranged in the equipment as well. More particularly, When the equipment control panel is constructed into a structure like a flat plate, a circuit pattern on the circuit board is caused to act as an antenna, to thereby facilitate introduction of the high-frequency noise into the equipment control panel, so that the noise causes malfunction of a control unit arranged in the equipment.

In order to avoid the problem, it would be considered that a shield casing is grounded while substantially covering the circuit pattern on the circuit board with the shield casing, to thereby keep the noise from entering the equipment through the wiring pattern of the equipment control panel, resulting in protecting the control unit of the equipment. Unfortunately, such an approach is not applied to the equipment control panel when it is constructed so as to be fixed on the equipment while being kept exposed on a surface of the equipment, because such construction fails to permit the whole equipment control panel to be covered with the shield casing. In such a case, it is possible to form a conductive shield layer on a front surface of an insulating spacer positioned on the wiring pattern of the circuit board or a rear surface of an insulating cover sheet member in a manner to be opposite to the circuit pattern of the circuit board, to thereby prevent any external noise from entering the equipment. However, it was found that such a conductive shield layer fails to prevent malfunction of the control unit or a failure in operation thereof due to discharge of static electricity charged on the insulating cover sheet member. Also, it was found that when the equipment control panel is provided therein with electronic components such as an IC for signal processing and the like, discharge of static electricity charged on the insulating cover sheet member causes a failure in operation of the electronic components.

Accordingly, it is an object of the present invention to provide an equipment control panel which is capable of preventing a failure in operation of a control unit due to discharge of static electricity charged on an insulating cover sheet member.

It is another object of the present invention to provide an equipment control panel which is capable of being readily mounted on an outer surface of a casing of an equipment, facilitating connection thereof to a control unit arranged in the equipment, and preventing a failure in operation of the control unit due to discharge of static electricity.

It is a further object of the present invention to provide an equipment control panel which is capable of being reduced in thickness and mounted on an outer surface of a casing of an equipment.

It is another object of the present invention to provide an equipment control panel which is capable of preventing any noise generated from an equipment from entering the panel.

DISCLOSURE OF INVENTION

The present invention is directed to an improvement in an equipment control panel including one or more operation signal generating switches for feeding an operation signal to a control unit received in an equipment. The equipment control panel is fixed directly on a casing of the equipment or fixed on a wall of a room in which the equipment is placed.

The equipment control panel according to the present invention generally includes a circuit board, an insulating spacer laminatedly arranged on the circuit board and an insulating cover sheet member laminatedly arranged on the insulating spacer. The circuit board is formed on a front surface thereof with a circuit pattern including one or more contact sections of the one or more operation signal generating switches. The insulating spacer is laminated on the front surface of the circuit board through an adhesive layer and includes one or more contact exposing windows through which the one or more contact sections are exposed. The adhesive layer may be constituted of only either an adhesive or a pressure-sensitive adhesive. Alternatively, it may be constructed in the form of either an adhesive double-coated sheet wherein an adhesive layer is formed on both surfaces of an insulating sheet or a pressure-sensitive adhesive double-coated sheet in which a pressure-sensitive adhesive layer is formed on both surfaces of an insulating sheet. When it is desired that any electronic component other than a switch is mounted on the circuit board, the insulating spacer is suitably formed with a window correspondingly. The insulating spacer may be constructed into either a single-layer structure or a multi-layer structure. One or more conductive members are arranged in a manner to correspond to the one or more contact exposing windows of the insulating spacer. The one or more conductive members are contacted with the one or more contact sections to generate an operation signal. The insulating cover sheet member is laminated on the insulating spacer through an adhesive layer and constructed so that at least a portion thereof corresponding to the one or more conductive members exhibits flexibility. A spacer for dimension adjustment may be arranged between the conductive member and the insulating cover member as required. The insulating cover sheet member may be constructed into either a single-layer structure or a multi-layer structure as in the insulating spacer.

A conductive shield layer is formed on a front surface of the insulating spacer, a rear surface thereof or a rear surface of the insulating cover sheet member and arranged so as to be opposite to a whole of the circuit pattern or a main section thereof. The conductive shield layer functions to prevent any external noise from entering the equipment control panel. In the present invention, the conductive shield layer is groundable and arranged so that an outer peripheral edge thereof is positioned inside an outer peripheral edge of the insulating spacer or insulating cover sheet member to keep the conductive shield layer from being externally exposed. In other words, the conductive shield layer has a contour pattern reduced as compared with that of each of the insulating spacer and insulating cover sheet member. Such arrangement permits the adhesive layer to cover the outer peripheral edge of the conductive shield layer, to thereby prevent the conductive shield layer from being exposed on a surface of lamination of the circuit board, insulating spacer and insulating cover sheet member. This keeps static electricity charged on a surface of the insulating cover sheet member positioned on the conductive shield layer from being discharged through the conductive shield layer. Such discharge of static electricity charged on the surface of the insulating cover sheet member through an exposed end of the conductive shield layer into the control unit due to substantial exposure of the conductive shield layer on the lamination surface causes a disadvantage such as malfunction of the control unit or a failure in operation thereof. Also, when electronic components such as an IC and the like which constitute a signal processing circuit are arranged on the circuit board, a variation in potential during the discharge possibly leads to malfunction of the electronic components or breakage thereof. As described above, the present invention prevents static electricity charged on the surface of the insulating cover sheet member from being discharged through the conductive shield layer, to thereby eliminate such disadvantages as described above.

When the equipment control panel is mounted on the casing of the equipment, at least the circuit board includes a main section formed on a front surface thereof with a circuit pattern including one or more contact sections of the one or more operation signal generating switches and a lead-out section extending from the main section and formed thereon with a plurality of connection line patterns connected to the circuit pattern. Also, when the conductive shield layer is formed on the insulating spacer or insulating cover sheet member, it is preferable that the insulating spacer or insulating cover sheet member is likewise provided thereon with a lead-out section formed thereon with a connection line pattern for grounding the conductive shield layer in a manner to be integral with a main section. Such construction significantly facilitates grounding of the conductive shield layer.

When the present invention is so constructed that a main section of the equipment control panel is constituted of a laminate, resulting in the lead-out section which forms a part of the circuit board and the lead-out section of the insulating spacer leading out of the laminate, mounting of the equipment control panel on the casing of the equipment may be completed by merely introducing the lead-out sections into the casing of the equipment and fixing the laminate on an outer surface of the casing of the equipment. Thus, the equipment control panel of the present invention facilitates mounting thereof on the outer surface of the casing of the equipment and connection thereof to the control unit arranged in the equipment. Also, the above-described construction of the laminate permits a reduction in thickness of the equipment control panel.

The present invention may be constructed in a manner to eliminate arrangement of the insulating spacer. More particularly, the present invention may be so constructed that the insulating cover sheet member is arranged through an adhesive layer on the circuit board and then the conductive shield layer is formed on the insulating cover sheet layer. In such construction as well, it can be considered that the adhesive layer through which the circuit board and insulating cover sheet member are joined to each other functions also as the insulating spacer. In this instance, the insulating cover sheet member is provided with a lead-out section, which is formed with the wiring pattern for grounding through which the conductive shield layer is grounded.

Also when the insulating spacer or insulating cover sheet member is formed on the rear surface thereof with the conductive shield layer, the connection line pattern for grounding connected to the conductive shield layer is formed on the rear surface of the lead-out section of each of the members, whereas the lead-out section of the circuit board is formed on the front surface thereof with the connection line pattern. This fails to permit the connection line pattern for grounding and the connection line pattern of the circuit board to be connected to the control unit by means of a single connector. In order to avoid such a problem, in the present invention, the lead-out section of the circuit board and the lead-out section of the insulating spacer are arranged so as to extend side by side with each other. The lead-out section of the insulating spacer includes a first portion linearly extending in a direction away from the main section, a second portion linearly extending in a direction substantially perpendicular to the first portion on both sides of the first portion and a third portion extending in a direction substantially perpendicular to the second portion while being away from the main section and linearly aligned with the first portion when the second portion is bent at a central portion of the second portion, resulting in portions of the second portion on both sides of the central portion being rendered opposite to each other. The connection line pattern for grounding is arranged along the lead-out section of the insulating spacer so that a pair of holding portions for interposedly holding a part of the lead-out section of the circuit board therebetween when the second portion of the lead-out section is kept bent at the central portion thereof may be left on both ends of the second portion of the lead-out section. The second portion of the lead-out section of the insulating spacer is formed on a rear surface of a portion thereof on which the connection line pattern for grounding is arranged with an adhesive layer. Also, the second portion of the lead-out section is bent at the central portion thereof to fold the adhesive layer on itself, so that the holding portions in a pair interposedly hold a part of the lead-out section of the circuit board therebetween through the adhesive layer.

Such construction permits not only the connection line pattern for grounding of the third portion and the connection line pattern of the circuit board to face on the same side (front side) but the lead-out section of the insulating spacer and the lead-out section of the circuit board to be fixed with respect to each other, so that the connection patterns may be connected to the control unit by means of only one connector. Formation of the conductive shield layer on the rear surface of the insulating cover sheet member may be carried out in substantially the same manner.

The equipment control panel of the present invention may include at least one electric component such as a luminous element for indicating a state of operation of the equipment or the like. When the electric component is increased in thickness and the equipment control panel is desired to be mounted on the outer surface of the casing of the equipment, the equipment control panel may be constituted of a first flexible circuit board on which the electric component is arranged, a second flexible circuit board provided thereon with the contact sections of the operation signal generating switches and laminated on the first flexible circuit board, an insulating spacer laminated on the second flexible circuit board and a flexible insulating cover sheet member laminated on the insulating spacer. In this instance, the first flexible circuit board includes a main section formed on a front surface thereof with a first circuit pattern to which the one or more electric components are connected and a lead-out section extending from the main section and formed thereon with a plurality of connection line patterns connected to the first circuit pattern. The second flexible circuit board includes a main section and a lead-out section. The main section of the second flexible circuit board is formed on a front surface thereof with a second circuit pattern including the one or more contact sections of the one or more operation signal generating switches and formed with an electric component receiving window for receiving the one or more electric components therein. The lead-out section of the second flexible circuit board is formed with a plurality of connection line patterns extending from the main section of the second flexible circuit board and connected to the second circuit pattern. The flexible insulating spacer includes one or more contact exposing windows through which the one or more contact sections are exposed and an electric component receiving window for receiving the one or more electric components therein and is laminated on the front surface of the second flexible circuit board. Also, the flexible insulating spacer includes a main section provided on a front or rear surface thereof with a conductive shield layer in a manner to be opposite to a whole of the circuit patterns of the circuit boards or a main section thereof and a lead-out section extending from the main section of the flexible insulating spacer and formed with a connection line pattern for grounding through which the conductive shield layer is grounded. Further, one or more conductive members are arranged in a manner to correspond to the one or more contact exposing windows of the insulating spacer and contacted with the one or more contact sections to generate the operation signal. The flexible insulating cover sheet member is laminated on the insulating spacer. The main sections of the first and second flexible circuit boards, the main section of the insulating spacer and the insulating cover sheet member are laminated on each other in order through adhesive layers, to thereby provide a laminate. The lead-out section of the first flexible circuit board, the lead-out section of the second flexible circuit board and the lead-out section of the insulating spacer are arranged so as to extend from the laminate in a manner to be insertable into the equipment. The conductive shield layer is arranged so that an outer peripheral edge thereof is positioned inside an outer peripheral edge of the main section of the insulating spacer. The outer peripheral edge of the conductive shield layer is covered with the adhesive layer to keep the conductive shield layer from being externally exposed from the laminate.

The thus-formed laminate may be joined directly to the outer surface of the equipment through an adhesive layer. Alternatively, the present invention may be constructed in such a manner that a reinforcing sheet member which is reduced in flexibility as compared with the first flexible circuit board is joined to the rear surface of the first flexible circuit board and then a rear conductive shield layer is formed on a front surface of the reinforcing sheet member. Such construction, when the casing of the equipment is made of a non-conductive material such as a plastic material or the like other than metal, effectively prevents noise generated in the casing of the equipment from entering the equipment control panel through a rear side thereof. In this instance, the rear surface of the reinforcing sheet member is fixedly joined to the outer surface of the equipment through an adhesive layer.

When the first and second flexible circuit boards are arranged without positively using the insulating spacer, the conductive shield layer is formed on a rear surface of the insulating cover sheet member in substantially the same manner as described above.

Also, an insulating spacer may be arranged between the first flexible circuit board and the second flexible circuit board, to thereby adjust a thickness of the equipment control panel.

BRIEF DESCRIPTION OF DRAWINGS

FIG. 2 is a plan view showing an embodiment of an equipment control panel according to the present invention;

FIG. 4 is a plan view showing a first flexible circuit board incorporated in the equipment control panel of FIG. 2;

BEST MODES FOR CARRYING OUT INVENTION

Now, the present invention will be described hereinafter in connection with preferred embodiments thereof with reference to the accompanying drawings.

Figure 1:
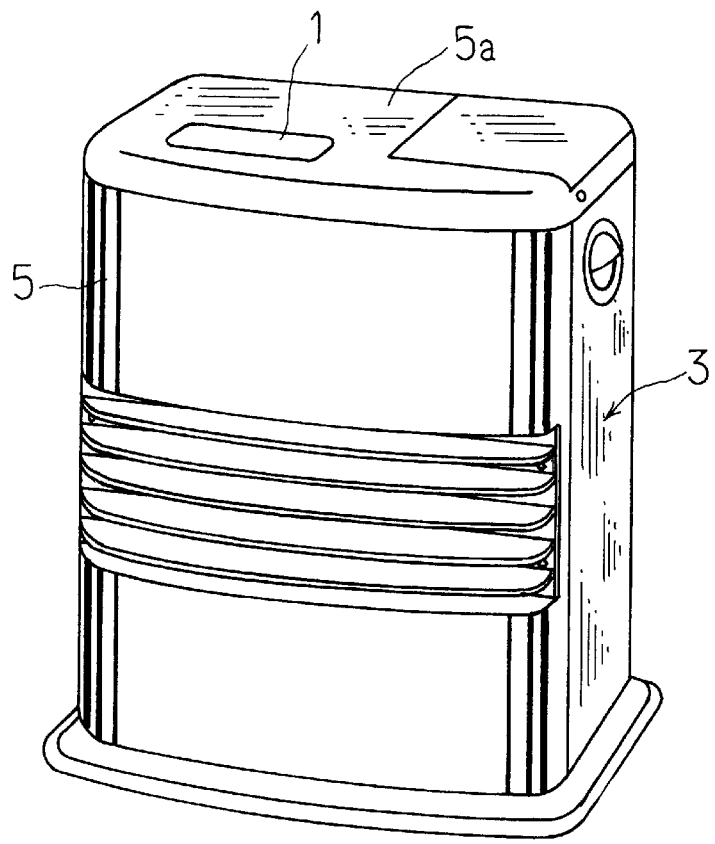
FIG. 1 is a perspective view showing an oil-fired space heater such as a fan heater to which an equipment control panel of the present invention may be applied by way of example.

Referring first to FIG. 1, an oil-fired space heater (oil burner) such as a fan heater to which an equipment control panel 1 according to the present invention may be applied is illustrated by way of example while being generally designated at reference numeral 3. The equipment control panel 1 is joined onto a top plate 5a of a casing 5 of the oil-fired space hater 3 by means of either an adhesive or a pressure-sensitive adhesive. FIG. 2 is a plan view showing an embodiment of the equipment control panel 1 of the present invention. The top plate 5a has an adhesion region to which the equipment control panel 1 is adhered slightly recessed thereon as compared with the remaining part thereof. The adhesion region of the top plate 5a is formed with a slit of a reduced size (not shown), through which three lead-out sections 13B, 15B and 33B extending from the equipment control panel 1 are inserted into the casing 5. In order to mount the equipment control panel 1 on the casing 5, the lead-out sections 13B, 15B and 33B are inserted into the casing 5. The lead-out sections 13B, 15B and 33B are provided at a distal end thereof with two connectors 7 and 9, through which the equipment control panel 1 is electrically connected to a control unit 11 arranged or received in the casing 5 of the oil-fired space heater 3.

Figure 3:
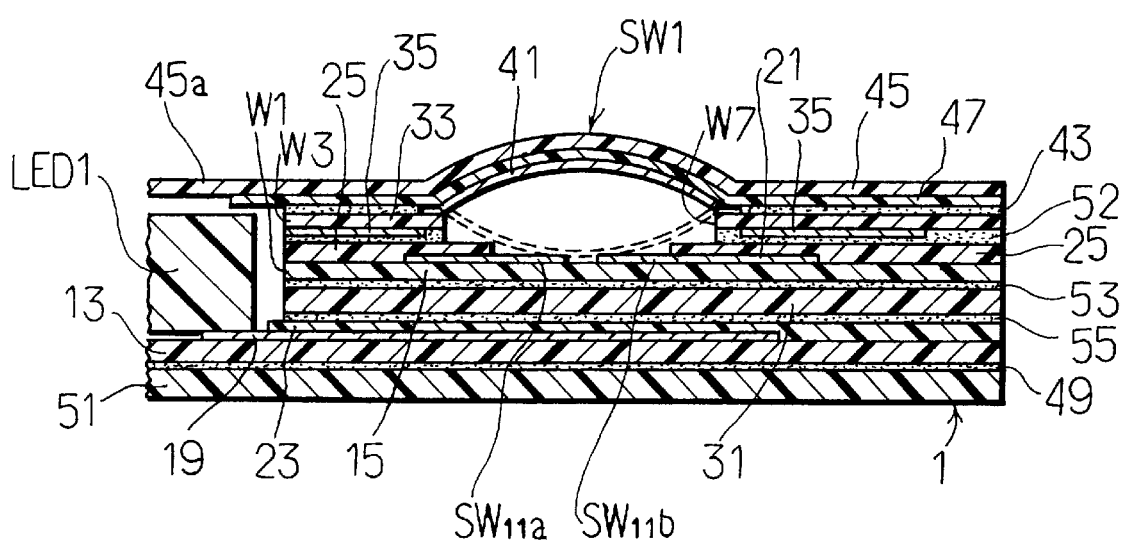
FIG. 3 is a sectional view taken along line III—III of FIG. 2.
Figure 5:
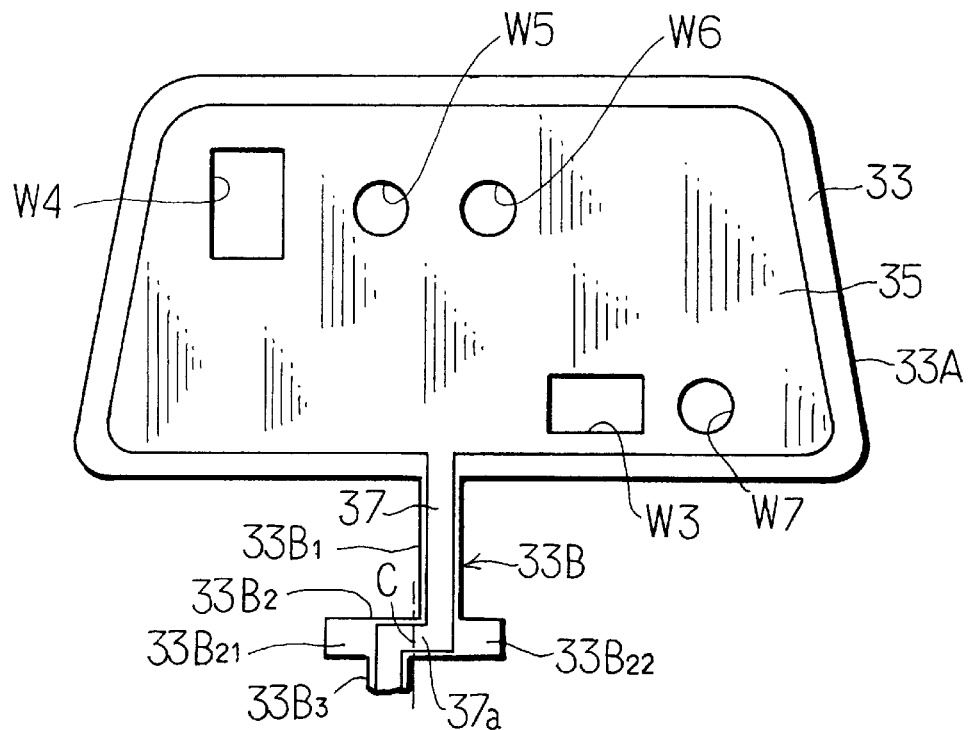
FIG. 5 is a bottom view showing a rear surface of an insulating spacer arranged between a first flexible circuit board and a second flexible circuit board so as to act as a spacer in the equipment control panel of FIG. 2.
Figure 6:
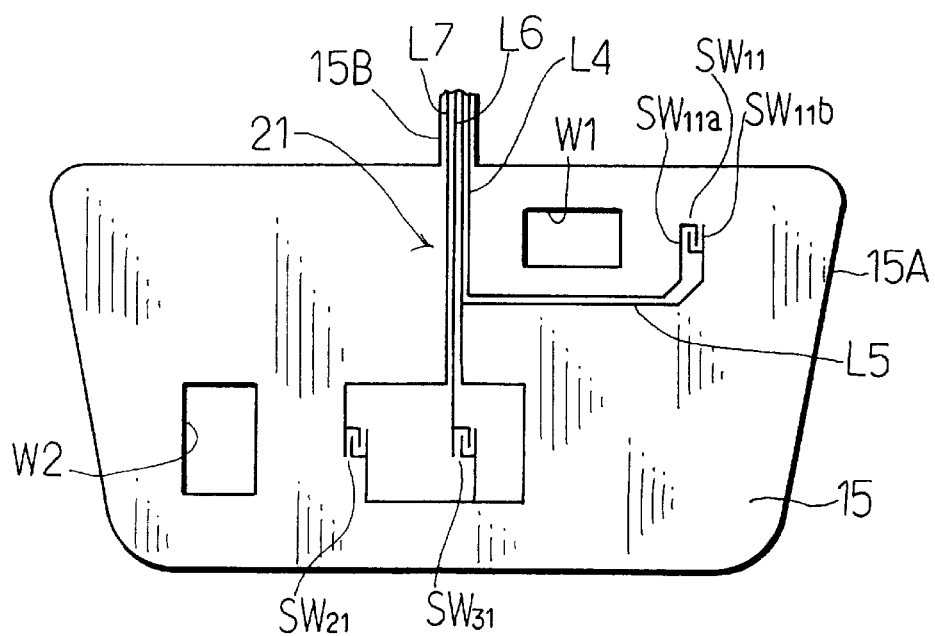
FIG. 6 is a plan view showing a second flexible circuit board incorporated in the equipment control panel of FIG. 2.

FIG. 3 is a sectional view taken along line III—III of FIG. 2, FIGS. 4 and 6 are plan views showing a first flexible circuit board 13 and a second flexible circuit board 15 incorporated in the equipment control panel 1 of FIG. 2, respectively, and FIG. 5 is a bottom view showing a rear surface of an insulating spacer 33 arranged between the first flexible circuit board 13 and the second flexible circuit board 15. The first flexible circuit board 13 and second flexible circuit board 15 include a first circuit pattern 19 and a second circuit pattern 21 each formed of a conductive paste such as a silver paste into a thick film on a front surface of a flexible substrate material such as a polyester film or the like by printing, respectively. Alternatively, the first circuit pattern 19 and second circuit pattern 21 may be formed into a thin film by vapor deposition. As shown in FIG. 3, the first flexible circuit board 13 and second flexible circuit board 15 are formed on a portion of a front surface thereof other than a portion thereof on which contacts and electrodes of the first and second circuit patterns 19 and 20 are arranged with insulating overcoat layers 23 and 25, respectively, which are made of an insulating paste by screen printing. As shown in FIG. 4, the first circuit pattern 19 formed on a main section 13A of the first flexible circuit board 13 includes a wiring group LG1 including a plurality of wirings connected to electrodes of a numeral indication plate 27 having a plurality of light emitting diodes incorporated therein and acting as a luminous display electric component, two wirings L1 and L2 respectively connected to luminous elements constituted by two light emitting diodes LED1 and LED2 arranged on both sides of a light-permeable member 29 made of an acrylic plate or the like, and a wiring L3 acting as a ground. The lead-out section 13B of the first flexible circuit board 13 is formed with a plurality of connection line patterns constituted by extensions of the wiring group LG1 and wirings L1 to L3 of the first circuit pattern 19. The lead-out section 13B is provided at a distal end thereof with wirings, which are not shown in FIG. 4 for the sake of brevity. Also, the lead-out section 13B is formed at the distal end thereof with a connector connection electrode (not shown) which is connected to the connector 7 shown in FIG. 2. The connector connection electrode thus arranged at the distal end of the lead-out section 13B is inserted into the casing 5 of the equipment 3 and then inserted into the connector 7 fixed on a control substrate of the control unit 11 arranged in the casing 5 of the equipment 3.

The light emitting diodes LED1 and LED2 each are constituted by a chip-like light emitting diode and connected to an electrode arranged on the first circuit pattern 19 by means of a conductive adhesive. The light emitting diodes LED1 and LED2 are operated so as to emit light for on-off indication of operation of the equipment. Light emitted from each of the light emitting diodes LED1 and LED2 is permitted to enter the light-permeable member 29, to thereby constitute a large luminous source. The numeral indication plate 27 is constructed so as to display numerals to carry out indication of a level of operation of the equipment and a temperature thereof, as well as indication of an error in operation thereof.

The second circuit pattern 21 formed on the front surface of the second flexible circuit board 15, as shown in FIG. 6, includes contact sections SW11 to SW31 of three push-on switches SW1 to SW3 (FIG. 2) and wirings L4 to L7. In this connection, the wirings L4 and L5 are connected at an end thereof to a pair of contacts SW11a and SW11b of the contact section SW11. Also, the second flexible circuit board 15 is formed at a portion thereof positionally corresponding to the light emitting diodes LED1 and LED2 and light-permeable member 29 shown in FIG. 4 with a first window W1, as well as at a portion thereof positionally corresponding to the numeral indication plate 27 shown in FIG. 4 with a second window W2.

Also, the equipment control panel of the illustrated embodiment, as shown in FIG. 3, includes an insulating spacer 31 arranged between the first flexible circuit board 13 and the second flexible circuit board 15 so as to provide a spacer layer of a single-layer structure provided with two windows aligned with the two windows W1 and W2 formed at the second flexible circuit board 15. The insulating spacer 31 is in the form of a porous insulating sheet exhibiting flexibility and elasticity, which is made of a polyester resin powder by compression under heating.

In the illustrated embodiment, as shown in FIGS. 3 and 5, the second flexible circuit board 15 has a main section 33A of an insulating spacer 33 laminated on the front surface of the second flexible circuit board 15. The insulating spacer 33 is formed of a flexible sheet material of synthetic resin such as, for example, a polyester film. The main section 33A, as shown in FIG. 5, is formed with two windows W3 and W4 of a rectangular shape. The rectangular windows W1 and W2 are positioned in a manner to be aligned with the windows W1 and W2 formed on the second flexible circuit board 15, respectively. Also, the insulating spacer 33 is formed with three windows W5 to W7 of a circular shape which permit the contact sections SW11 to SW31 (see FIG. 6) formed on the front surface of the second flexible circuit board 15 to be exposed therethrough, respectively. Also, the main section 33A of the insulating spacer 33 is formed on a rear surface thereof or a surface thereof opposite to the front surface of the second flexible circuit board 15 with a conductive shield layer 35 of a size and a configuration opposite to a portion of the second circuit pattern 21 except the contact sections SW11 to SW31 formed on the front surface of the second flexible circuit board 15. The conductive shield layer 35 may be made in the form of a thick film using a conductive paste prepared, for example, by adding a powder of a conductive material such as Ag, Pd, Cu, C or the like to a synthetic resin paste material. Alternatively, the conductive shield layer 35 may be made in the form of a conductive thin film by vapor deposition or the like. Also, the lead-out section 33B of the insulating spacer 33 is provided on a rear surface thereof with a connection line pattern 37 for grounding, which is concurrently formed during formation of the conductive shield layer 35.

Figure 7:
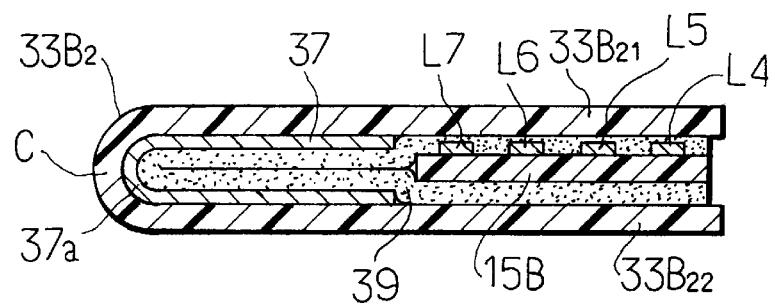
FIG. 7 is a sectional view taken along line VII—VII of FIG. 2.

As shown in FIG. 2, the lead-out section 15B of the second flexible circuit board 15 is arranged adjacently to the lead-out section 33B of the insulating spacer 33 while being laterally juxtaposed thereto. The lead-out section 33B of the insulating spacer 33, as shown in FIG. 5, includes a first portion 33B1 linearly extending in a direction away from the main section 33A, a second portion 33B2 linearly extending in a direction substantially perpendicular to the first portion 33B1 on both sides of the first portion 33B1 and a third portion 33B3 extending in a direction substantially perpendicular to the second portion 33B2 while being away from the main section 33A and linearly aligned with the first portion 33B1 when the second portion 33B2 is bent at a central portion C of the second portion 33B2, resulting in portions of the second portion 33B2 on both sides of the central portion C being rendered opposite to each other as shown in FIG. 7. The connection line pattern 37 for grounding is arranged along the lead-out section 33B of the insulating spacer 33 so that a pair of holding portions 33B21 and 33B22 for interposedly holding a part of the lead-out section 15B of the second flexible circuit board 15 therebetween when the second portion 33B2 of the lead-out section 33B are kept bent at the central portion C may be left on both ends of the second portion 33B2 of the lead-out section 33B. This results in the connection line pattern 37 for grounding being provided at an intermediate portion thereof with a crank portion 37a bent into a crank-like shape. The second portion 33B2 of the lead-out section 33B of the insulating spacer 33, as shown in FIG. 7, is formed on a rear surface of a portion thereof on which the crank portion 37a of the connection line pattern 37 for grounding is arranged with an adhesive layer 39, which is made of a pressure-sensitive adhesive. Thus, when the second portion 33B2 of the lead-out section 33B is bent at the central portion to fold the adhesive layer 39 on itself as shown in FIG. 7, the holding portions 33B21 and 33B22 in a pair interposedly hold a part of the lead-out section 15B of the second flexible circuit board 15 therebetween through the adhesive layer 39. The adhesive layer 39 functions to gently curve the crank portion 37a of the connection line pattern 37 for grounding when the second portion 33B2 of the lead-out section 33B is bent at the central portion C, resulting in effectively preventing breakage of the connection line pattern 37 for grounding.

Such construction permits the connection line pattern 37 for grounding of the third portion 33B3 and the connection line patterns (ends of L4 to L7) of the second flexible circuit board 15 to face on the same side (front surface side). Also, it permits the lead-out section 33B of the insulating spacer 33 and the lead-out section 15B of the second flexible circuit board 15 to be fixed with respect to each other. This results in the connection patterns (37 and ends of L4 to L7) to be connected to the control unit 11 by means of the single connector 9 as shown in FIG. 2.

Also, the circular windows W5 to W7 of the insulating spacer 33 shown in FIG. 5 each are provided thereon with a dishlike conductive member 41 (FIG. 3) so that an outer peripheral edge thereof is positioned outside each of the windows W5 to W7. The dish-like conductive members 41 are contacted with the contacts SW11 to SW31 respectively corresponding thereto, to thereby generate an operation signal. The dish-like conductive members 41 each are made of a metal plate widely known in the art which is subject to deformation due to application pressing force thereto and inverted due to release of the pressing force therefrom, resulting in returning to the original state.

The illustrated embodiment, as shown in FIG. 3, is so constructed that an insulating cover sheet member 45 is laminatedly arranged on the insulating spacer 33 through an adhesive layer 43 formed of a transparent adhesive or pressure-sensitive adhesive. The insulating cover sheet member 45 is made of a transparent polyester film so that portions thereof corresponding to switch operation sections or portions thereof designated at reference characters SW1 to SW3 in FIG. 2 may exhibit flexibility. Also, the insulating cover sheet member 45 is formed on a rear surface thereof with a printing ink layer 47 while keeping at least portions thereof corresponding to a luminous section exhibiting light-permeability. More specifically, the insulating cover sheet member 45 is formed on the rear surface thereof with the printing ink layer 47 of a predetermined pattern while keeping portions of the member 45 designated at reference characters 45a and 45b in FIG. 2 exhibiting light-permeability.

In the illustrated embodiment, a reinforcing sheet member 51 which is made of an insulating material and reduced in flexibility as compared with the first flexible circuit board 13 is joined through an adhesive layer 49 to a rear surface of the first flexible circuit board 13 for the purpose of reinforcing the first flexible circuit board 13. Arrangement of the reinforcing sheet member 51 is not necessarily required in the illustrated embodiment. Thus, the first flexible circuit board 13 may be joined directly to the casing 5 of the equipment through an adhesive layer made of either an adhesive or a pressure-sensitive adhesive.

Reference numeral 52 designates an adhesive layer 52 which joins the first flexible circuit board 13 and insulating spacer 31 to each other therethrough, 53 is an adhesive layer for joining the insulating spacer 31 and second flexible circuit board 15 to each other, and 55 is an adhesive layer for joining the second flexible circuit board 15 and insulating spacer 33 to each other. The adhesive layers may be made of only either an adhesive or a pressure-sensitive adhesive. Alternatively, it may be made of an adhesive double-coated sheet formed by applying an adhesive or pressure-sensitive adhesive onto both surfaces of an insulating sheet material. The adhesive layers cooperate with each other to integrate the members with each other, resulting in providing a laminate.

In the illustrated embodiment, the first flexible circuit board 13 and second flexible circuit board 15 are laminated on each other. Alternatively, when any luminous element is not incorporated in the equipment control panel or the luminous element is highly reduced in thickness, the laminate may be constituted of a single flexible circuit board.

In the illustrated embodiment, the conductive shield layer 35, as shown in FIG. 5, is so arranged that an outer peripheral edge thereof is positioned inside an outer peripheral edge of the main section 33A of the insulating spacer 33, so that the outer peripheral edge of the conductive shield layer 35 is covered with the adhesive layer 52 when the laminate is formed. This keeps the conductive shield layer 35 from being externally exposed.

Figure 8:
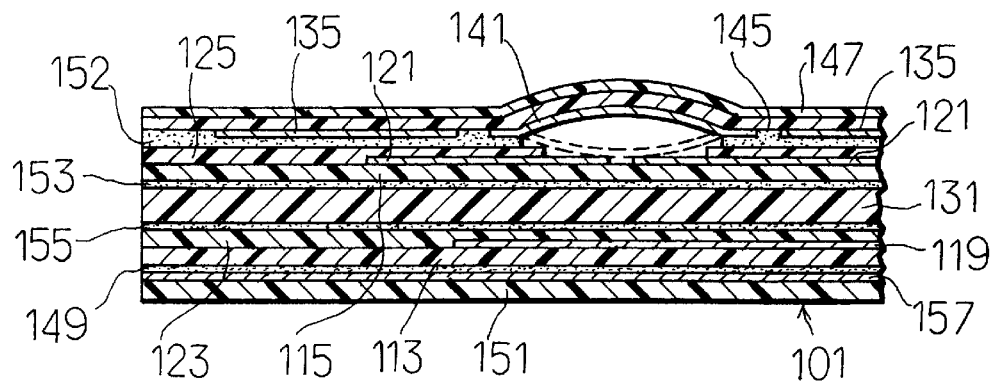
FIG. 8 is a sectional view showing an essential part of another embodiment of an equipment control panel according to the present invention.

Referring now to FIG. 8, an essential part of another embodiment of an equipment control panel according to the present invention is illustrated. In the illustrated embodiment, reference numerals correspond to the reference numerals discussed in the embodiment described above, except with additional prefix of 100. Comparing the embodiment of FIG. 8 with the embodiment shown in FIGS. 2 to 7, the former is different from the latter in that an adhesive layer 152 is used as an insulating spacer for arrangement of an insulating cover sheet member 145 without positively arranging an insulating spacer on a second flexible circuit board 115, the insulating cover sheet member 145 is formed on a rear surface thereof (which is opposite to a front surface of the second flexible circuit board 115) with a conductive shield layer 135, the insulating cover sheet member 145 is formed on a front surface thereof with a printing ink layer 147, and a reinforcing sheet member 151 is formed on a front surface thereof with a rear conductive shield layer 157. Such construction of the illustrated embodiment not only permits a structure thereof to be simplified but reduces a number of steps in manufacturing of the equipment control panel, leading to a substantial reduction in manufacturing cost thereof.

When the insulating cover sheet member 145 is formed on the rear surface thereof with the conductive shield layer 135, the insulating cover sheet member 145 is provided with a lead-out section. In addition, the lead-out section is formed thereon with a connection line pattern for grounding which is connected to the conductive shield layer 135. In the illustrated embodiment as well, the conductive shield layer 135 is so formed that an outer peripheral edge thereof is positioned inside an outer peripheral edge of the insulating cover sheet member 145. Such formation of the conductive shield layer 135, as shown in FIG. 8, permits the outer peripheral edge of the conductive shield layer 135 to be covered with the adhesive layer 152, to thereby keep the conductive shield layer 135 from being exposed on an outer surface of a laminate. In the illustrated embodiment as well, the lead-out section of the insulating cover sheet member 145 is formed on a rear surface thereof with a connection line pattern for grounding connected to the conductive shield layer 135 as in the embodiment described above, so that such a structure as shown in FIGS. 5 and 7 is preferably employed in the illustrated embodiment as well.

Formation of the rear conductive shield layer 157 on the front surface of the reinforcing sheet member 151 effectively prevents noise generated in the casing 5 of the equipment from intruding into the equipment control panel 1 through the rear surface thereof even when the casing 5 of the equipment is made of a non-conductive material such as plastic resin other than metal.

Figure 9:
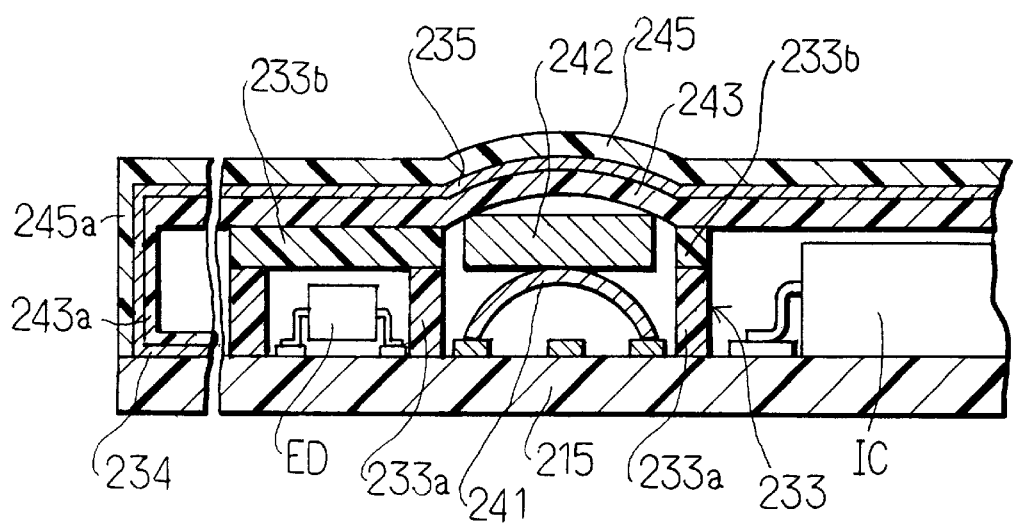
FIG. 9 is a sectional view showing an essential part of a further embodiment of an equipment control panel according to the present invention.

Referring now to FIG. 9, an essential part of a further embodiment of an equipment control panel according to the present invention is illustrated, which is adapted to be mounted on a wall of a room in which an equipment is placed as well as on the equipment. An equipment control panel of the illustrated embodiment includes a rigid circuit board 215 which is made of a glass-epoxy resin substrate, a phenolic resin substrate or the like. The circuit board 215 is mounted thereon with an integrated circuit IC and an electronic component ED such as a chip resistor or the like for signal processing in addition to a push-on switch. Also, the circuit board 215 is laminatedly provided thereon with an insulating spacer member 233 through an adhesive layer (not shown). The insulating spacer member 233 is constructed into a two-layer structure. An upper spacer member 233b is laminated on a lower spacer member 233a for the purpose of adjusting a thickness of the equipment control panel, so that the integrated circuit IC increased in thickness may be incorporated in the equipment control panel. Also, in the illustrated embodiment, in order to further facilitate incorporation of the integrated circuit IC increased in thickness into the equipment control panel, an additional insulating spacer member 242 is arranged on a conductive member 241 of the push-on switch. In the illustrated embodiment, a conductive shield layer 235 is formed on a rear surface of an insulating cover sheet member 245. In the illustrated embodiment as well, the conductive shield layer 235 has a contour defined inside that of the insulating cover sheet member 245 or has an outer peripheral edge positioned inside that of the insulating cover sheet member 245. In the illustrated embodiment, an adhesive double-coated sheet 235 which has a pressure-sensitive adhesive coated on both surface thereof is used as an adhesive layer. Also, the conductive shield layer 235. Further, the conductive shield layer 235 is connected to a ground electrode of a circuit pattern on the circuit board 215. The connection line pattern 234 is interposedly arranged between lead-out sections 243a and 245a of the insulating cover sheet member 245 and adhesive double-coated sheet 235, to thereby be prevented from being exposed.

The illustrated embodiment may be constructed in such a manner that a main section of the equipment control panel is constructed in the form of a laminate and lead-out sections constituting a part of the circuit board are led out of the laminate as in the first and second embodiments described above. Such construction permits mounting of the equipment control panel on the equipment to be completed merely by introducing the leadout sections into the casing of the equipment and fixing the laminate on the outer surface of the casing of the equipment. Thus, the equipment control panel of each of the embodiments may be readily mounted on the outer surface of the casing of the equipment. Also, it facilitates connection of the equipment control panel to the control unit arranged in the equipment. In addition, the above-described construction of the laminate permits a reduction in thickness of the equipment control panel.

Industrial Applicability

In the present invention, the conductive shield layer is so formed that the outer peripheral edge thereof is positioned inside that of the insulating spacer or insulating cover sheet member. Thus, the conductive shield layer is covered at the outer peripheral edge with the adhesive layer, to thereby be prevented from being exposed externally or on the lamination surface. This prevents static electricity charged on the surface of the insulating cover sheet member from being discharged through the conductive shield layer, to thereby eliminate disadvantages such as malfunction of the control unit, breakage or malfunction of the electronic components due to a substantial variation in potential, and the like.

What is claimed is:

1. An equipment control panel including one or more operation signal generating switches for feeding an operation signal to a control unit received in an equipment, comprising:

a circuit board formed on a front surface thereof with a circuit pattern including one or more contact sections of said one or more operation signal generating switches;

an insulating spacer laminated on said front surface of said circuit board through an adhesive layer and including one or more contact exposing windows through which said one or more contact sections are exposed;

one or more conductive members arranged in a manner to correspond to said one or more contact exposing windows of said insulating spacer and contacted with said one or more contact sections to generate said operation signal;

an insulating cover sheet member laminated on said insulating spacer through an adhesive layer and constructed so that at least a portion thereof corresponding to said one or more conductive members exhibits flexibility; and a conductive shield layer formed on a front surface of said insulating spacer, a rear surface thereof or a rear surface of said insulating cover sheet member and arranged so as to be opposite to a whole of said circuit pattern or a main section thereof;

said conductive shield layer being groundable and arranged so that an outer peripheral edge thereof is positioned inside an outer peripheral edge of said insulating spacer or insulating cover sheet member to keep said conductive shield layer from being externally exposed.

2. An equipment control panel as defined in claim 1, wherein said circuit board is mounted thereon with an electronic component which constitutes a signal processing circuit; and said conductive shield layer is arranged in a manner to be opposite to said electronic components.

3. An equipment control panel which includes one or more operation signal generating switches for feeding an operation signal to a control unit received in an equipment and is fixed on a casing of the equipment, comprising:

a circuit board including a main section formed on a front surface thereof with a circuit pattern including one or more contact sections of said one or more operation signal generating switches and a lead-out section extending from said main section and formed thereon with a plurality of connection line patterns connected to said circuit pattern;

an insulating spacer laminated on said front surface of said circuit board and including one or more contact exposing windows through which said one or more contact sections are exposed;

one or more conductive members arranged in a manner to correspond to said one or more contact exposing windows of said insulating spacer and contacted with said one or more contact sections to generate said operation signal;

an insulating cover sheet member laminated on said insulating spacer and constructed so that at least a portion thereof corresponding to said one or more conductive members exhibits flexibility; and a conductive shield layer formed on a front surface of said insulating spacer, a rear surface thereof or a rear surface of said insulating cover sheet member and arranged so as to be opposite to a whole of said circuit pattern or a main section thereof;

said main section of said circuit board, said insulating spacer and said insulating cover sheet member being laminated on each other in order through adhesive layers to provide a laminate;

said conductive shield layer being groundable and arranged so that an outer peripheral edge thereof is positioned inside an outer peripheral edge of said insulating spacer or insulating cover sheet member to keep said conductive shield layer from being externally exposed.

4. An equipment control panel as defined in claim 3, wherein said insulating spacer is integrally provided with a lead-out section formed with a connection line pattern for grounding connected to said conductive shield layer to ground said conductive shield layer.

5. An equipment control panel as defined in claim 4, wherein said lead-out section of said circuit board and said lead-out section of said insulating spacer are arranged so as to extend side by side with each other;

said lead-out section of said insulating spacer includes a first portion linearly extending in a direction away from said main section, a second portion linearly extending in a direction substantially perpendicular to said first portion on both sides of said first portion and a third portion extending in a direction substantially perpendicular to said second portion while being away from said main section and linearly aligned with said first portion when said second portion is bent at a central portion of said second portion, resulting in portions of said second portion on both sides of said central portion being rendered opposite to each other;

said connection line pattern for grounding is arranged along said lead-out section of said insulating spacer so that a pair of holding portions for interposedly holding a part of said lead-out section of said circuit board therebetween when said second portion of said lead-out section is kept bent at said central portion thereof may be left on both ends of said second portion of said lead-out section;

said second portion of said lead-out section of said insulating spacer is formed on a rear surface of a portion thereof on which said connection line pattern for grounding is arranged with an adhesive layer; and said second portion of said lead-out section is bent at said central portion thereof to fold said adhesive layer on itself, so that said holding portions in a pair interposedly hold a part of said lead-out section of said circuit board therebetween through said adhesive layer.

6. An equipment control panel which includes one or more operation signal generating switches for feeding an operation signal to a control unit received in an equipment and one or more electric components including one or more luminous elements for indicating operation of the equipment and is fixed on a casing of the equipment, comprising:

a first flexible circuit board including a main section formed on a front surface thereof with a first circuit pattern to which said one or more electric components are connected and a lead-out section extending from said main section and formed thereon with a plurality of connection line patterns connected to said first circuit pattern;

a second flexible circuit board laminated on said first flexible circuit board and including a main section and a lead-out section;

said main section of said second flexible circuit board being formed on a front surface thereof with a second circuit pattern including one or more contact sections of said one or more operation signal generating switches and formed with an electric component receiving window for receiving said one or more electric components therein;

said lead-out section of said second flexible circuit board extending from said main section and being formed with a plurality of connection line patterns connected to said second circuit pattern;

a flexible insulating spacer including one or more contact exposing windows through which said one or more contact sections are exposed and an electric component receiving window for receiving said one or more electric components therein and laminated on said front surface of said second flexible circuit board;

said flexible insulating spacer including a main section provided on a front or rear surface thereof with a conductive shield layer in a manner to be opposite to a whole of said circuit patterns of said circuit boards or a main section thereof and a lead-out section extending from said main section of said insulating spacer and formed with a connection line pattern for grounding through which said conductive shield layer is grounded;

one or more conductive members arranged in a manner to correspond to said one or more contact exposing windows of said insulating spacer and contacted with said one or more contact sections to generate said operation signal; and a flexible insulating cover sheet member laminated on said insulating spacer;

said main sections of said first and second flexible circuit boards, said main section of said insulating spacer and said insulating cover sheet member being laminated on each other in order through adhesive layers, to thereby provide a laminate;

said lead-out section of said first flexible circuit board, said lead-out section of said second flexible circuit board and said lead-out section of said insulating spacer being arranged so as to extend from said laminate in a manner to be insertable into the equipment;

said conductive shield layer being arranged so that an outer peripheral edge thereof is positioned inside an outer peripheral edge of said main section of said insulating spacer;

said outer peripheral edge of said conductive shield layer being covered with said adhesive layer to keep said conductive shield layer from being externally exposed from said laminate.

7. An equipment control panel as defined in claim 6, further comprising an additional insulating spacer arranged between said first flexible circuit board and said second flexible circuit board.

8. An equipment control panel as defined in claim 7, wherein said first flexible circuit board has a reinforcing sheet member, which is reduced in flexibility as compared with said first flexible circuit board, joined to a rear surface thereof;

said reinforcing sheet member being formed on a front surface thereof with a rear conductive shield layer;

and said reinforcing sheet member being fixed through an adhesive layer on an outer surface of the equipment.

9. An equipment control panel as defined in claim 6, wherein said first flexible circuit board has a reinforcing sheet member which is reduced in flexibility as compared with said first flexible circuit board joined to a rear surface thereof;

said reinforcing sheet member being formed on a front surface thereof with a rear conductive shield layer;

said reinforcing sheet member being fixed through an adhesive layer on an outer surface of the equipment.

10. An equipment control panel as defined in claim 6, wherein said lead-out section of said second flexible circuit board and said lead-out section of said insulating spacer are arranged so as to extend side by side with each other;

said lead-out section of said insulating spacer includes a first portion linearly extending in a direction away from said main section, a second portion linearly extending in a direction substantially perpendicular to said first portion on both sides of said first portion and a third portion extending in a direction substantially perpendicular to said second portion while being away from said main section and linearly aligned with said first portion when said second portion is bent at a central portion of said second portion, resulting in portions of said second portion on both sides of said central portion being opposite to each other;

said connection line pattern for grounding is arranged along said lead-out section of said insulating spacer so that a pair of holding portions for interposedly holding a part of said lead-out section of said second flexible circuit board therebetween when said second portion of said lead-out section is kept bent at said central portion thereof may be left on both ends of said second portion of said lead-out section;

said second portion of said lead-out section of said insulating spacer is formed on a surface of a portion thereof on which said connection line pattern for grounding is arranged with an adhesive layer; and said second portion of said lead-out section is bent at said central portion thereof to fold said adhesive layer on itself, so that said holding portions in a pair interposedly hold a part of said lead-out section of said second flexible circuit board therebetween through said adhesive layer.

11. An equipment control panel which includes one or more operation signal generating switches for feeding an operation signal to a control unit received in an equipment and is fixed on a casing of the equipment, comprising:

a circuit board including a main section formed on a front surface thereof with a circuit pattern including one or more contact sections of said one or more operation signal generating switches and a lead-out section extending from said main section and formed thereon with a plurality of connection line patterns connected to said circuit pattern;

an adhesive layer laminated on said front surface of said circuit board and including a contact exposing window through which said one or more contact sections are exposed;

one or more conductive members arranged in a manner to correspond to said contact exposing window of said adhesive layer and contacted with said contact sections to generate said operation signal; and an insulating cover sheet member laminated on said front surface of said circuit board through said adhesive layer and constructed so that at least a portion thereof corresponding to said conductive member exhibits flexibility;

said insulating cover sheet member being formed with a conductive shield layer so as to be opposite to a whole of said circuit pattern or a main section thereof;

said conductive shield layer being groundable and arranged so that an outer peripheral edge thereof is positioned inside an outer peripheral edge of said insulating cover sheet member to keep said conductive shield layer from being externally exposed.

12. An equipment control panel which includes one or more operation signal generating switches for feeding an operation signal to a control unit received in an equipment and one or more electric components including one or more luminous elements for indicating operation of the equipment and is fixed on a casing of the equipment, comprising:

a first flexible circuit board including a main section formed on a front surface thereof with a first circuit pattern to which said one or more electric components are connected and a lead-out section extending from said main section and formed thereon with a plurality of connection line patterns connected to said first circuit pattern;

a second flexible circuit board laminated on said first flexible circuit board and including a main section and a lead-out section;

said main section of said second flexible circuit board being formed on a front surface thereof with a second circuit pattern including one or more contact sections of said one or more operation signal generating switches and formed with an electric component receiving window for receiving said one or more electric components therein;

said lead-out section of said second flexible circuit board being arranged so as to extend from said main section of said second flexible circuit board and formed with a plurality of connection line patterns connected to said second circuit pattern;

an adhesive layer including a contact exposing window through which said one or more contact sections are exposed and laminated on said front surface of said circuit board;

one or more conductive members arranged in a manner to correspond to said contact exposing window of said adhesive layer and contacted with said contact sections to generate said operation signal; and an flexible insulating cover sheet member laminated on said front surface of said circuit board through said adhesive layer and including a main section and a lead-out section;

said main section of said flexible insulating cover sheet member being formed on a rear surface thereof with a conductive shield layer in a manner to be opposite to a whole of said circuit pattern or a main section thereof;

said lead-out section of said flexible insulating cover sheet member being arranged so as to extend from said main section of said insulating cover sheet member and formed with a connection line pattern for grounding through which said conductive shield layer is grounded;

said lead-out section of said first flexible circuit board, said lead-out section of said second flexible circuit board and said lead-out section of said insulating cover sheet member being arranged so as extend from a laminate in a manner to be insertable into the equipment;

said conductive shield layer being arranged so that an outer peripheral edge thereof is positioned inside an outer peripheral edge of said insulating cover sheet member;

said conductive shield layer being covered at said outer peripheral edge thereof with said adhesive layer, resulting in being kept from being externally exposed.

13. An equipment control panel as defined in claim 12, further comprising an additional insulating spacer arranged between said first flexible circuit board and said second flexible circuit board.

14. An equipment control panel as defined in claim 13, wherein said first. flexible circuit board has a reinforcing sheet member, which is reduced in flexibility as compared with said first flexible circuit board, joined to a rear surface thereof;

said reinforcing sheet member being formed on a front surface thereof with a rear conductive shield layer;

and said reinforcing sheet member being fixed through an adhesive layer on an outer surface of the equipment.

15. An equipment control panel as defined in claim 12, wherein said first flexible circuit board has a reinforcing sheet member which is reduced in flexibility as compared with said first flexible circuit board joined to a rear surface thereof;

said reinforcing sheet member being formed on a front surface thereof with a rear conductive shield layer;

said reinforcing sheet member being fixed through an adhesive layer on an outer surface of the equipment.

16. An equipment control panel as defined in claim 12, wherein said lead-out section of said second flexible circuit board and said lead-out section of said insulating spacer are arranged so as to extend side by side with each other;

said lead-out section of said insulating cover sheet member includes a first portion linearly extending in a direction away from said main section, a second portion linearly extending in a direction substantially perpendicular to said first portion on both sides of said first portion and a third portion extending in a direction substantially perpendicular to said second portion while being away from said main section and linearly aligned with said first portion when said second portion is bent at a central portion of said second portion, resulting in portions of said second portion on both sides of said central portion being rendered opposite to each other;

said connection line pattern for grounding is arranged along said lead-out section of said insulating spacer so that a pair of holding portions for interposedly holding a part of said lead-out section of said second flexible circuit board therebetween when said second portion of said lead-out section is kept bent at said central portion thereof may be left on both ends of said second portion of said lead-out section;

said second portion of said lead-out section of said insulating cover sheet member is formed on a surface of a portion thereof on which said connection line pattern for grounding is arranged with an adhesive layer; and said second portion of said lead-out section is bent at said central portion thereof to fold said adhesive layer on itself, so that said holding portions in a pair interposedly hold a part of said lead-out section of said second flexible circuit board therebetween through said adhesive layer.

* * * * *